United States Patent
Tsai

(10) Patent No.: US 9,425,773 B2
(45) Date of Patent: Aug. 23, 2016

(54) DIGITAL CONTROL RING OSCILLATOR AND METHOD OF ASSEMBLING SAME

(71) Applicant: Taiwan Semiconductor Manufacturing Co., Ltd., Hsin-Chu (TW)

(72) Inventor: Tsung-Hsien Tsai, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 49 days.

(21) Appl. No.: 14/105,278

(22) Filed: Dec. 13, 2013

(65) Prior Publication Data

US 2015/0171838 A1    Jun. 18, 2015

(51) Int. Cl.
*H03K 3/03* (2006.01)
*H03K 5/13* (2014.01)
*H03K 5/14* (2014.01)

(52) U.S. Cl.
CPC ............ *H03K 3/0315* (2013.01); *H03K 5/131* (2013.01); *H03K 5/14* (2013.01)

(58) Field of Classification Search
USPC ................ 327/261, 264, 271, 272, 284, 285
See application file for complete search history.

(56) References Cited

U.S. PATENT DOCUMENTS

| | | | |
|---|---|---|---|
| 5,061,907 A * | 10/1991 | Rasmussen | 331/57 |
| 6,798,678 B2 * | 9/2004 | Komurasaki et al. | 363/157 |
| 7,821,293 B2 * | 10/2010 | Fazzi | H03K 19/018521 326/33 |
| 8,427,245 B2 * | 4/2013 | Sandhu | 331/57 |
| 8,461,893 B2 * | 6/2013 | Gasper | H03K 5/133 327/261 |
| 8,525,569 B2 * | 9/2013 | Bucelot | G06F 1/10 257/777 |
| 2014/0103985 A1 * | 4/2014 | Andreev et al. | 327/262 |

* cited by examiner

*Primary Examiner* — An Luu
(74) *Attorney, Agent, or Firm* — Duane Morris LLP

(57) ABSTRACT

A digital control ring oscillator (DCO) generally comprises a first delay element and at least one second delay element that is coupled to the first delay element, wherein each of the first and second delay elements are disposed laterally with respect to one another in a first direction and include at least one cell. The cell includes a plurality of transistors arranged in at least one stack.

20 Claims, 9 Drawing Sheets

DIGITAL CONTROL RING OSCILLATOR AND METHOD OF ASSEMBLING SAME

FIELD OF DISCLOSURE

The embodiments described herein relate to integrated circuits ("ICs") and, more particularly, to a digital control ring oscillator ("DCO") that is used with ICs, wherein the DCO includes devices that are arranged in at least one three-dimensional ("3D") stack.

BACKGROUND

Generally, an integrated circuit ("IC") is a circuit in which all or some of the circuit elements are inseparably associated and electrically interconnected so that it is considered to be indivisible. An IC is commonly embodied in a wafer. A wafer can be a slice or flat disk, of semiconductor material or, for example, of semiconductor material deposited on a substrate, in which circuits or devices are simultaneously processed and, if there is more than one device, subsequently separated into dies. The wafer can have logic circuitry that forms a high speed digital circuit, such as digital logic for a digital phase locked loop ("PLL") circuit, for example. A digital controlled ring oscillator ("DCO") is a component of the PLL circuit that facilitates clock generation in a wide range of application-specific integrated circuits (ASICs) including, but not limited to, network controllers, I/O controllers, graphics processors, or the like. As such, the DCO covers a wide frequency range from about 1 GHz to about 4 GHz for varying process, voltage, and temperature (PVT), and also has a fine resolution, such as about 0.5 MHz per least significant bit (LSB).

Having a wide frequency range and maintaining a fine resolution can be difficult in that the resolution is inversely proportional to the frequency step. For example, when the resolution is 0.5 MHz, the mean number of frequency steps is approximately 6000. As such, the DCO has 6000 devices, such as tri-state inverters, that cause the dimensions of the DCO to be over 300 µm×300 µm. The connection wire for 6000 tri-state inverters can be over approximately 500 µm, which results in a relatively large wire capacitance that is over approximately 200 fF. Such a high capacitance can prevent current consumption and prevent the DCO from obtaining optimal or maximum speeds. The two-dimensional (2D) layout for the devices, such as the tri-state inverters, can also inhibit current consumption and prevent the DCO from obtaining optimal or maximum speeds.

DETAILED DESCRIPTION

Figure 1A:
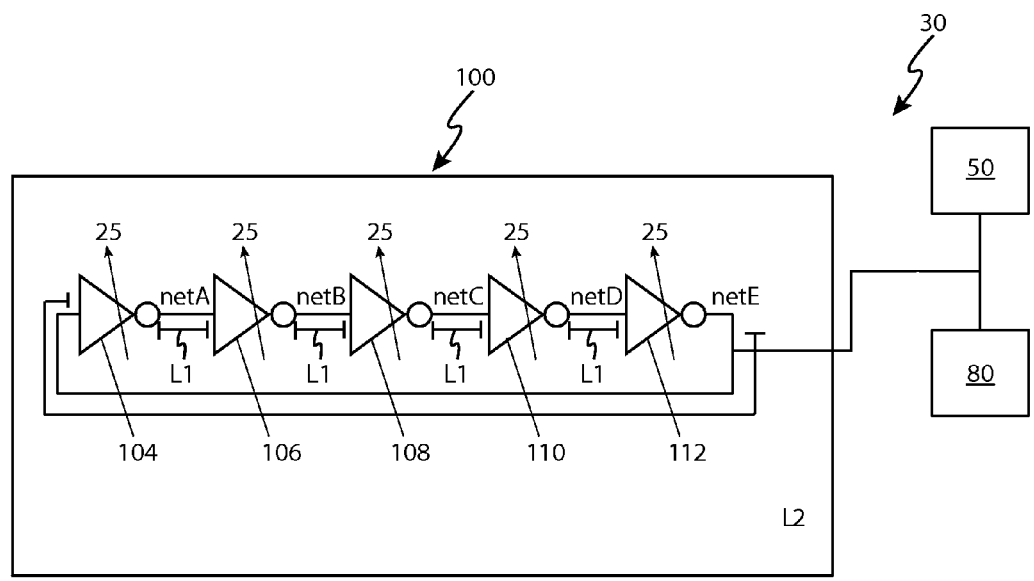
FIG. 1A is a block diagram of an integrated circuit ("IC") having a digital controlled ring oscillator ("DCO") having a plurality of delay elements in accordance with some embodiments.

This description of the exemplary embodiments is intended to be read in connection with the accompanying drawings, which are to be considered part of the entire written description.

In the drawings, plural like instances of a device are indicated by addition of a hyphen and ordinal number (e.g., "-1," "-2", . . . ) to the reference numeral associated with that item. For example, plural instances of a PMOS transistor 141 are labeled 141-1, 141-2, . . . .

The embodiments described herein include a digital control ring oscillator ("DCO") for use with an integrated circuit, wherein the DCO is configured to have low wire capacitances. In some embodiments, the DCO is formed as a monolithic three-dimensional ("3D") integrated circuit formed using stacked complementary metal oxide semiconductor ("CMOS") processing. For example, the 3D IC includes a plurality of vertically stacked "tiers" and wherein each tier includes a respective active device layer and a respective interconnect structure, which can include a plurality of conductive layers (e.g., M1, M2, etc.). In some embodiments, one or more interlayer dielectric layers ("ILDs") are disposed between adjacent tiers.

In some embodiments, the DCO includes a plurality of delay elements that are disposed laterally with respect to one another in a first direction. Each delay element includes a plurality of cells, wherein each cell includes a plurality of devices, such as a plurality of at least two different types of transistors. For example, in some embodiments, each cell includes a plurality of PMOS transistors and a plurality of NMOS transistors, wherein the PMOS transistors are vertically stacked on top of each other and the NMOS transistors are vertically stacked on top of each other. The stack of NMOS transistors can be disposed in parallel with respect to the stack of PMOS transistors. Alternatively, the stack of NMOS transistors can be stacked on top of or below the stack of PMOS transistors. When the transistors are stacked, the length of the connection wire for the transistors is short, which reduces the capacitance of the wire such that current consumption is reduced while enabling the DCO to achieve improved speeds.

FIG. 1A illustrates an embodiment of an integrated circuit ("IC") 30 that includes a port 50 and a memory 80 coupled to the port 50. The circuit of FIG. 1A can be used in a programmable system, including, but not limited to, systems and microcontrollers, reduced instruction set circuits ("RISC"), application specific integrated circuits ("ASIC"), and programmable logic circuits ("PLC"). The above examples are exemplary only, and thus are not intended to limit in any way the uses of the circuit. As used herein, the term "couple" is not limited to a direct mechanical, thermal, communication, and/or an electrical connection between components, but may also include an indirect mechanical, thermal, communication and/or electrical connection between multiple components.

In some embodiments, IC 30 includes a DCO 100 that is coupled to port 50 and memory 80. In some embodiments, DCO 100 includes a first delay element 104 coupled to a second delay element 106 using a conductive line, such as an interlayer via (ILV) or a connection wire (netA), a third delay element 108 coupled to second delay element 106 using a conductive line, such as a via or connection wire (netB), a fourth delay element 110 coupled to third delay element 108 using a conductive line, such as a via or connection wire (netC), a fifth delay element 112 coupled to fourth element 110 using a conductive line, such as a via or connection wire (netD), and coupled to first delay element 108 using a conductive line, such as a via or connection wire (netE). While five elements are shown in FIG. 1A, DCO 100 is not limited to five delay elements and can have any number of delay elements (i.e., greater than or less than five) that enables DCO 100 and/or IC 30 to function as described herein.

In some embodiments, netA, netB, netC, and net D each have a length L1 that extends between adjacent delay elements. For example, netA extends from the output of delay element 104 to the input of delay element 106, and netB extends from the output of delay element 106 to the input of delay element 108. NetC extends from the output of delay element 108 to the input of delay element 110, and netD extends from the output of delay element 110 to the input of delay element 112. NetE has a length L2 and extends from the output of delay element 112 to the input of delay element 104. As explained in more detail below with respect to the remaining FIGS., each of the delay elements 104, 106, 108, 110, and 112 comprises 25 cells (described below with reference to FIGS. 1A-3) where each cell corresponds to a respective device. In some embodiments, the device of the cell is an inverter, such as a tri-state inverter, NMOS inverter, PMOS inverter, CMOS inverter, NPN transistor-transistor logic (TTL) inverter, or the like. For example, each of the cells includes a plurality of transistor devices, such as PMOS and NMOS transistor devices, and the transistor devices are coupled together to form a respective inverter. Alternatively, each of the delay elements 104, 106, 108, 110, and 112 can have any number of cells and/or devices that enable DCO 100 and/or IC 30 to function as described herein. In some embodiments, as explained in more detail below with respect to FIGS. 2A-3, the transistor devices in each of the delay elements are stacked such that the length L1 of netA, netB, netC, and net D is minimized.

Figure 1B:
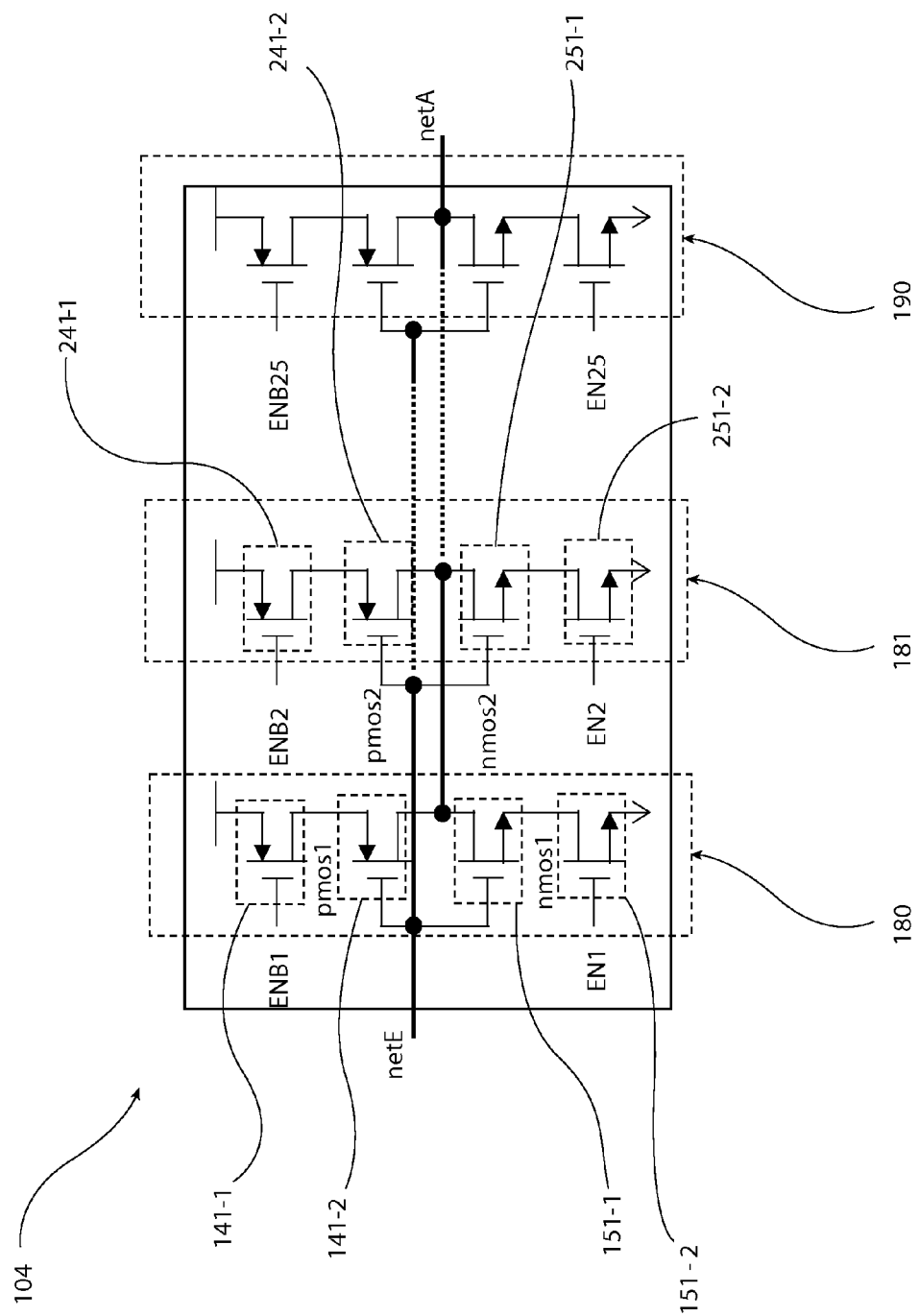
FIG. 1B is a circuit diagram of one of the delay elements of the DCO shown in FIG. 1A in accordance with some embodiments.

FIG. 1B is a schematic diagram of a delay element 104 of DCO 100 (shown in FIG. 1A). Delay element 104 includes a plurality of inverter cells that each include at least two types of transistor devices. For example, in some embodiments, a first inverter cell 180 includes transistor devices 141-1 and 141-2 that are each PMOS transistors. First inverter cell 180 also includes transistor devices 151-1 and 151-2 that are each NMOS transistors. A second inverter cell 181, within delay element 104, includes a pair of PMOS transistors 241-1 and 241-2 and a pair of NMOS transistors 251-1 and 251-2, as does inverter cell 190 having corresponding PMOS and NMOS transistors, which, for simplicity, are not labeled. In some embodiments, each of the individual transistor devices 141-1, 141-2, 151-1, 151-2, 241-1, 241-2, 251-1, and 251-2 includes a plurality of transistor devices or transistors (i.e., fingers).

Figure 1C:
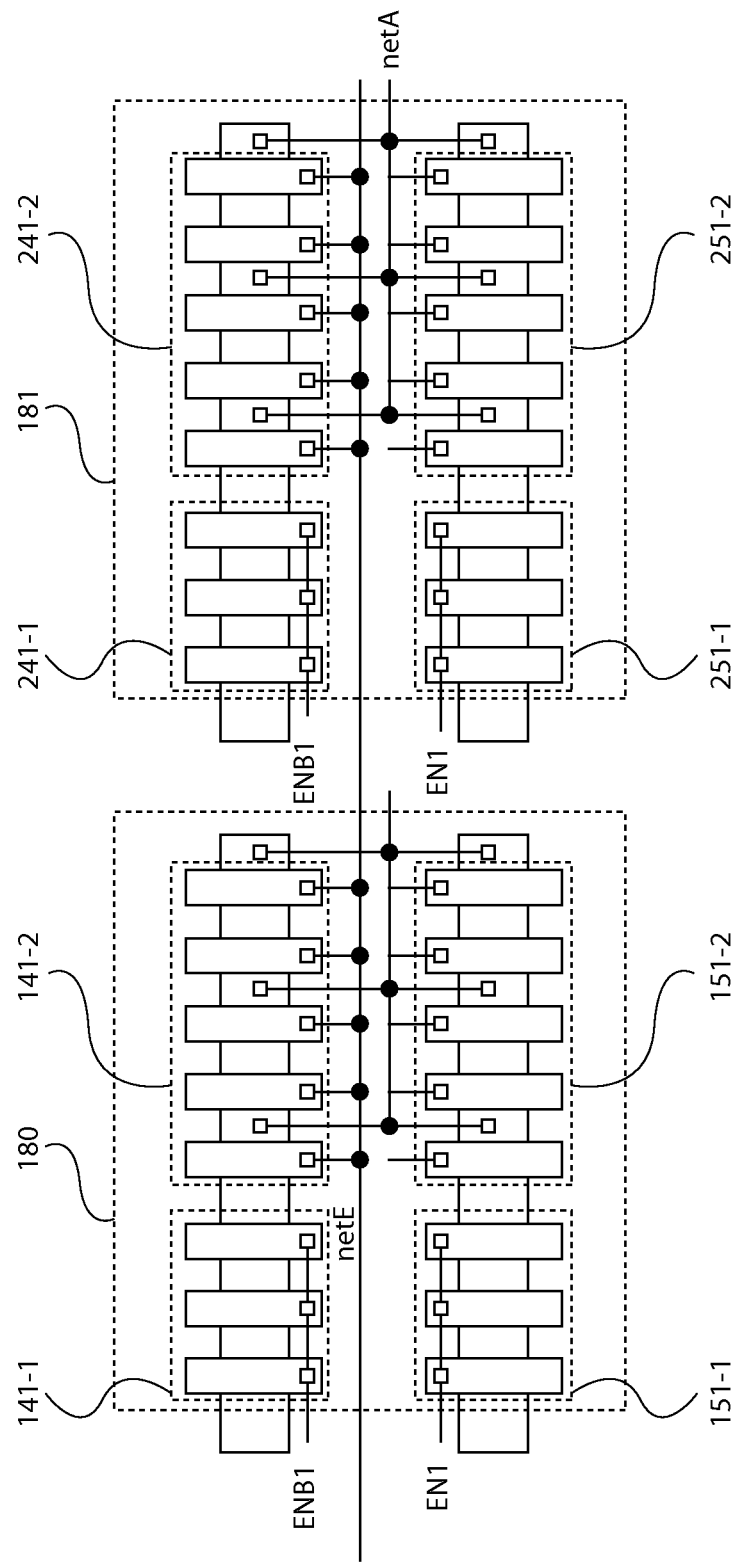
FIG. 1C is a block diagram of two of the delay elements of the DCO shown in FIG. 1A in accordance with some embodiments.

FIG. 1C is a plan view showing a two dimensional (2D) layout of the transistor devices 141-1, 141-2, 151-1, 151-2, 241-1, 241-2, 251-1, and 251-2. First inverter cell 180 includes PMOS transistors 141-1 and 141-2 laid out with eight fingers (each finger corresponding to a respective gate) and NMOS transistors 151-1 and 151-2 laid out with eight fingers. For each finger, the drain region of that finger also serves as the source region of the adjacent finger. Similarly, second inverter cell 181 includes PMOS transistor devices 241-1 and 241-2 laid out with eight fingers and NMOS transistor devices 251-1 and 251-2 laid out with eight fingers.

As shown in FIG. 1C, the PMOS transistors 141-1 have their gates coupled to receive the signal ENB1. The PMOS transistors 141-2 have their gates coupled to receive the signal netE, and their drains coupled to net A. The NMOS transistors 151-1 have their gates coupled to receive the signal EN1. The NMOS transistors 151-2 have their gates coupled to receive the signal netE, and their drains coupled to net A.

Similar to delay element 104, the other delay elements of DCO 100, such as delay elements 106, 108, 110, 112 (shown in FIG. 1A), each include a plurality of tri-state inverter cells that each include at least two types of transistor devices arranged as described for delay element 104. For example, FIG. 1C illustrates delay element 104 and delay element 106. Although first and second delay elements 104, 106 are illustrated as being laterally spaced from one another in a first direction (e.g., in the x-direction), in some embodiments, first delay element 104 and second delay element 106 are disposed laterally with respect to one another in a second direction (e.g., in the y-direction). In other embodiments, first delay element 104 and second delay element 106 are vertically stacked on top of one another (i.e., in the z-direction).

In some embodiments, the inverters 180, 181, . . . , 190 of delay element 104 are partially controlled by a pair of complementary control/enable signals EN1 and its complement ENB1. For example (referring to FIGS. 1B and 1C), PMOS transistor 141-1, and its finger(s) are configured to receive at least one control signal ENB. In some embodiments, the ENB signal corresponds to a bit of a control word for changing the operating frequency of DCO 100. For example, in delay element 104, the gate of PMOS transistor 141-1 of cell 180 is configured to receive the signal ENB1, and the gate of PMOS transistor 241-1 of cell 181 is configured to receive the signal ENB2. Similarly, the PMOS transistors of cell 190 are configured to receive the control signal ENB25. PMOS transistor(s) 141-2 and 241-2 receive another signal at their respective gates. For example, a signal is received at netE, which is coupled to the gate of transistors 141-2, 241-2, etc., and to the gate of transistors 151-2, 251-2, etc., and an inverted signal is output from netA, which is coupled to the drain of transistors 141-2, 241-2, etc., and to the drain of transistors 151-2, 251-2, etc. described below, in response to the received signal.

For each of the signals, such as ENB1, ENB2, and ENB25, there are complementary signals, such as EN1, EN2, and EN25, respectively. The drains of NMOS transistor(s) 151-1 of cell 180 are configured to receive the complementary signal EN1, and NMOS transistor 251-1 of cell 181 is configured to receive the complementary signal EN2. Similarly, the NMOS transistor of cell 190 is configured to receive the complementary signal EN25. As noted above, the gates of NMOS transistor(s) 151-2 and 251-2 are configured to receive a signal from netE, which is also coupled to the gates of transistors 141-2 as described above. In response to the signal received at netE, an inverted signal is output at netA, which is coupled to a via as described in greater detail below.

In some embodiments, as illustrated in FIGS. 2A-2D, the delay elements 104, 106, 108, 110, 112 are implemented in a 3D IC. For example, the delay elements 104, 106, 108, 110, 112 can be fabricated by a stacked CMOS process. In a stacked CMOS embodiment, all of the PMOS transistors of a cell, e.g., transistor devices 141-1, 141-2, and their fingers, can be arranged in a vertically stacked group.

Figure 2A:
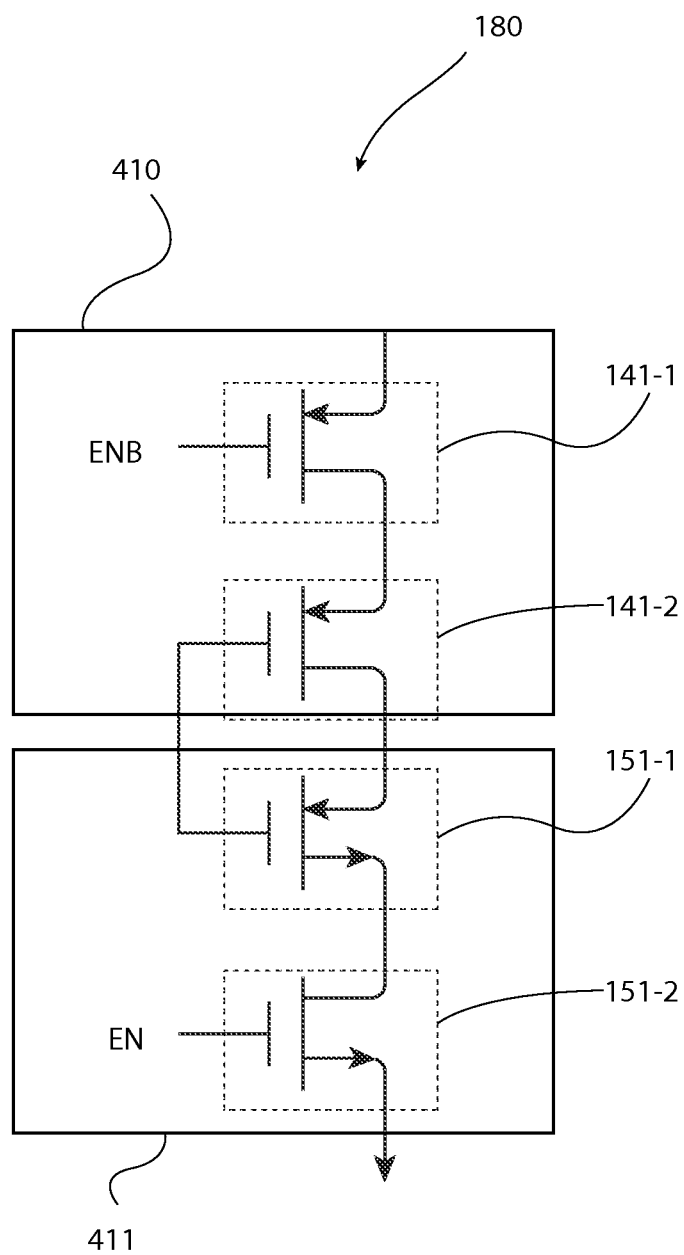
FIGS. 2A-2D are block diagrams of stacking layouts of a plurality of devices of the delay element shown in FIG. 1B in accordance with some embodiments.

FIG. 2A is a schematic diagram of the first inverter cell 180, according to some embodiments, including PMOS transistors 141-1 and 141-2 and NMOS transistors 151-1 and 151-2. The first inverter cell 180 is divided into a PMOS stack 410 including PMOS transistors 141-1, 141-2 and an NMOS stack 411, including NMOS transistors 151-1, 151-2. PMOS transistor 141-1 has its gate coupled to ENB and its source coupled to Vdd. PMOS transistor 141-2 and NMOS transistor 151-1 have their gates coupled to netE and their drains coupled to netA. NMOS transistor 151-2 has its gate coupled to EN and its source coupled to Vss. The four transistors shown in FIG. 2A form a tri-state inverter cell. In some embodiments, the delay elements 104, 106, 108, 110, 112 are implemented using tri-state inverters. In other embodiments (not shown), the inverters are not tri-state inverters, and the inverters can include a PMOS transistor 141-2 and an NMOS transistor 151-1, both having their gates G coupled to netE and their drains coupled to netA, for example.

According to some embodiments, the PMOS stack 410 and NMOS stack 411 can be arranged compactly in a 3D structure, such as a stacked CMOS configuration having a plurality of tiers.

Figure 2B:
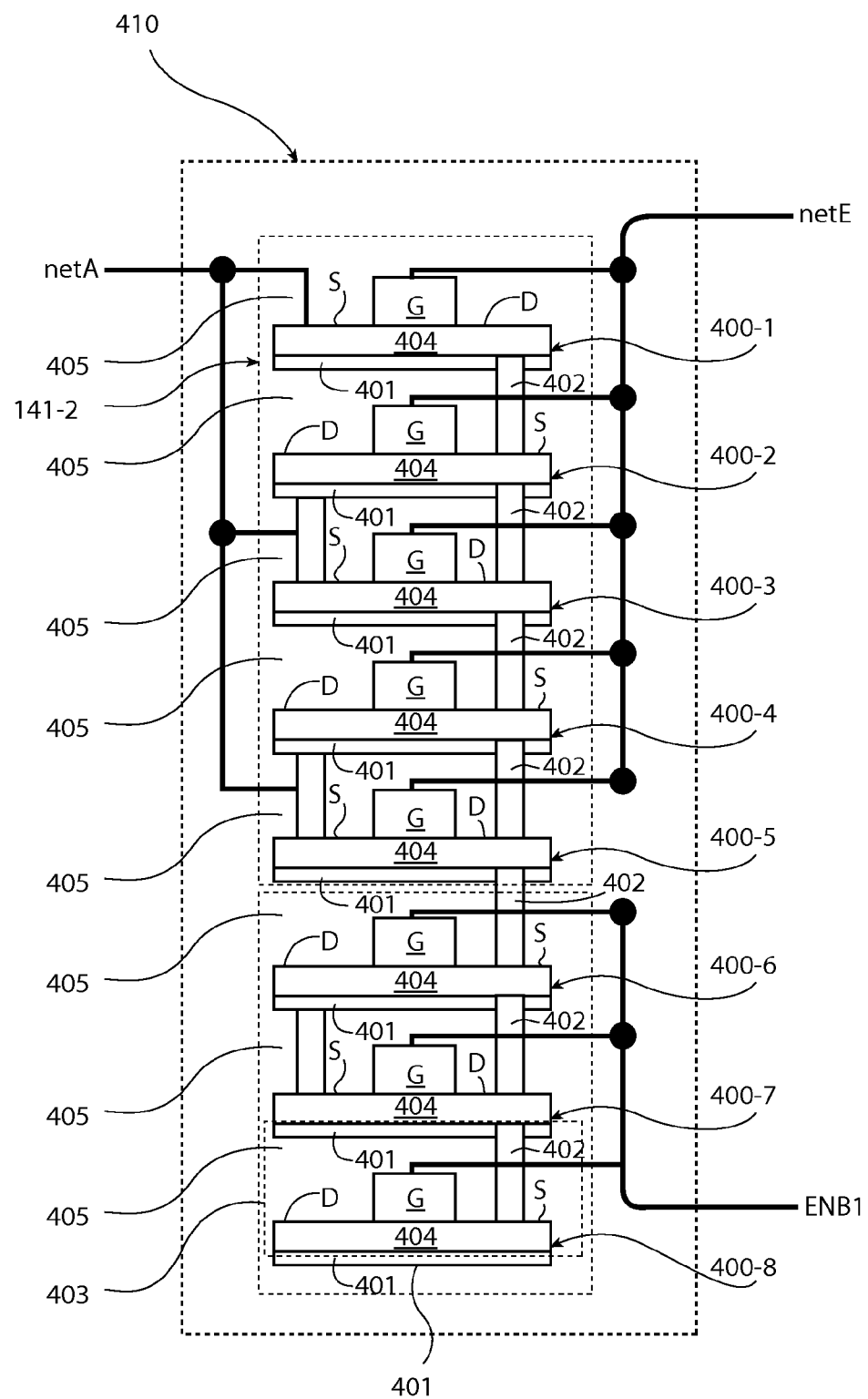

FIG. 2B is a cross-sectional view of the PMOS stack 410 shown in FIG. 2A, according to some embodiments. In some embodiments, the number of tiers in the PMOS stack 410 is selected to be the same as the number of fingers in the pair of transistor devices 141-1, 141-2 shown in FIG. 1C. For example, the serial PMOS device of FIG. 1C includes eight fingers (corresponding to eight gate conductors), all arranged in a single active device layer. In some embodiments, as shown in FIG. 2B, the PMOS transistors 141-1, 141-2 are divided among a plurality of tiers (layers), so that each layer has one transistor (finger) 400 arranged in a vertically stacked group.

The PMOS stack 410 of FIG. 2B is a stacked CMOS structure having a plurality of tiers 403. Each tier includes a semiconductor layer 404 with a respective PMOS transistor 400-1 to 400-8 formed thereon. Each transistor has a source S, a drain D and a gate G. In some embodiments, the semiconductor layer 404 is a thin semiconductor substrate, such as a silicon substrate. Each semiconductor layer 404 has a dielectric layer 405, such as an oxide or a nitride thereon. An interconnect structure 401 is provided above each dielectric layer 405. The interconnect structure 401 comprises a plurality of intermetal dielectric (IMD) layers. The IMD layers of each interconnect structure 401 include one or more conductive via layers (not shown) and one or more conductive line layers (not shown). Although the vias and conductive lines within the interconnect structures 401 are omitted from FIG. 2B for ease of viewing, the connections to netA, netE and ENB1 are shown schematically. In some embodiments, the semiconductor layer 404 of each respective tier is directly joined to an underlying interconnect structure 401 corresponding to the next lower tier. The transistor devices 400 are connected in series, drain-to-source, by inter-tier vias (ITV, also referred to as inter-level vias, ILV) 402.

Within the PMOS stack 410, one or more transistors 141-1 have their gates coupled to receive the ENB1 signal. For example, in FIG. 2B, transistors 400-5 to 400-7 have their gates G coupled to receive the ENB1 signal. One or more transistors 141-2 have their gates G coupled to receive the netE signal, and their sources S coupled to receive the netA signal. For example, in FIG. 2B, transistors 400-1 to 400-4 have their gates G coupled to receive the netE signal, and their sources S coupled to receive the netA signal. The couplings to the source S can be provided by way of contacts, local vias and local conductive lines, or by way of one or more ITV 402.

FIG. 2B shows a PMOS stack 410; the NMOS stack 411 is not shown in detail, but in some embodiments, the NMOS stack 411 has a similar stacked configuration to that shown in FIG. 2B, except that the external connections connect the drains of the transistor devices of the NMOS stack 411 to EN1, instead of ENB1. In the corresponding NMOS stack 411, each tier includes a semiconductor layer 404 with a respective NMOS transistor formed thereon. In some embodiments, the semiconductor layer 404 is a thin semiconductor substrate, such as a silicon substrate. Each semiconductor layer 404 has a dielectric layer 405, such as an oxide or a nitride thereon. An interconnect structure 401 is provided above each dielectric layer 405. The interconnect structure 401 comprises a plurality of intermetal dielectric (IMD) layers. The IMD layers of each interconnect structure 401 include one or more conductive via layers (not shown) and one or more conductive line layers (not shown). In some embodiments, the semiconductor layer 404 of each respective tier is directly joined to an underlying interconnect structure 401 corresponding to the next lower tier. The transistor devices 400 are connected in series, source-to-drain, by ITV 402.

Within the NMOS stack 411, one or more transistors 151-1 have their gates coupled to receive the EN1 signal. For example, three transistors (corresponding to transistors 400-5 to 400-7 in FIG. 2B) have their gates coupled to receive the EN1 signal. One or more transistors 151-2 have their gates coupled to receive the netE signal, and their sources coupled to receive the netA signal. For example, four transistors (corresponding to transistors 400-1 to 400-4 in FIG. 2B) have their gates coupled to receive the netE signal, and their sources coupled to receive the netA signal.

Figure 2C:
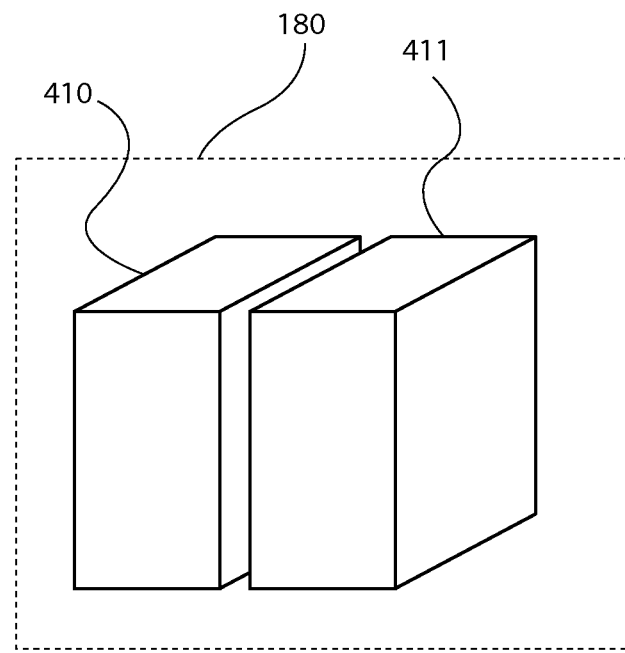

FIG. 2C shows a simplified graphical representation of the PMOS stack 410 and NMOS stack 411, which is used to represent an inverter in FIGS. 6 and 7, described below. The details shown in FIG. 2B are omitted from FIGS. 6 and 7, for ease of viewing. For brevity, the combination of the PMOS transistors 141-1 and 141-2 is referred to herein as PMOS stack 410, and the combination of the NMOS transistors 151-1 and 151-2 is referred to herein as NMOS stack 411.

Figure 2D:
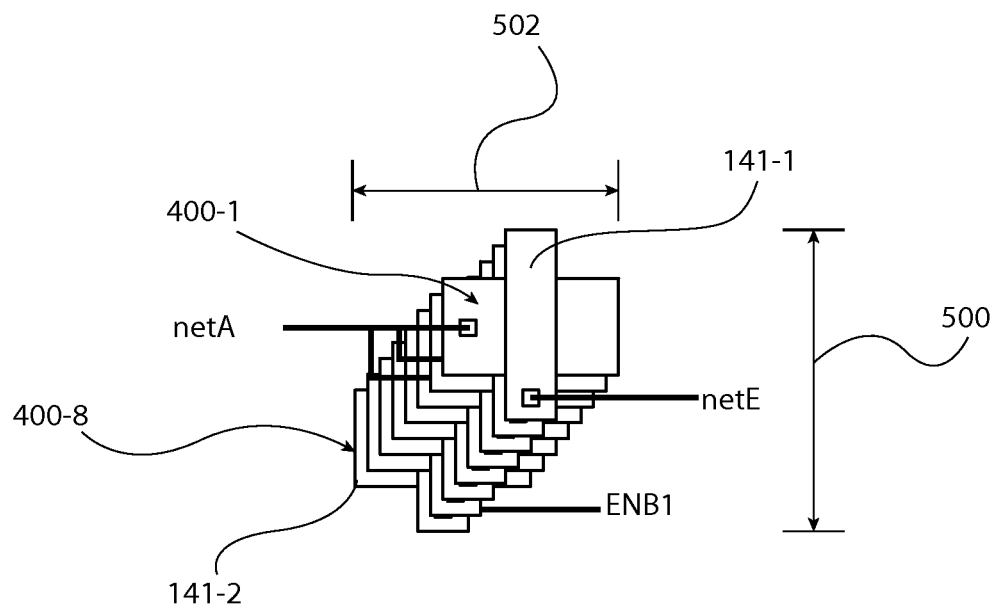

FIG. 2D is a perspective view of the PMOS stack 410 shown in FIG. 2C. As described above, each of the PMOS transistors 141-1 and 141-2 have a plurality of transistors (fingers) 400-1 to 400-8 that can be arranged in a vertically stacked group. For example, referring to FIGS. 2C and 2D each of the PMOS transistors 141-1 and 141-2 are arranged in a vertical stack such that one of the fingers 400-1 is stacked on top of another finger 400-1 (i.e., in the Z-direction). The NMOS transistors (shown in FIGS. 1B, 1C, and 2A-2C) are arranged in a similar stacking arrangement.

The configuration of the PMOS stack 410 in FIG. 2B can be represented by the same schematic diagram as the serial configuration of the first inverter cell 180 of FIG. 1C. For a given technology node, the PMOS stack 410 occupies a much smaller horizontal footprint than the first inverter cell 180. When the PMOS transistors and the NMOS transistors are stacked in a 3D configuration, the in-plane dimensions of the stacks are relatively compact. For example, in some embodiments, as shown in FIGS. 2B and 2D, by using the stacked configuration, the dimensions of the stack of the PMOS transistors has a length 500 (shown in FIG. 2D) of 0.25 micrometer and a width 502 (shown in FIG. 2D) of 0.25 micrometer. In some embodiments, in the stacked configuration, the length L1 (shown in FIG. 1A) of netA, netB, netC, and net D is in the range of about 13 micrometers to about 50 micrometers or in the range of about 13 micrometers to about 30 micrometers. Similarly, in some embodiments, the length L2 (shown in FIG. 1A) of netE is in the range of about 13 micrometers to about 50 micrometers or in the range of about 13 micrometers to about 30 micrometers. In some embodiments (not shown), the length L1 and the length L2 is each about 13 micrometers. As such, the wire (conductive line) lengths are reduced from about 100 micrometers seen in some known DCOs to about 13 micrometers in the embodiments of DCO 100 described herein. That is, the stacked configuration of the devices within DCO 100 enables the use of shorter wires. The relatively shorter wire lengths of DCO 100 facilitate a reduction in wire capacitance. Therefore, current consumption is reduced and DCO 100 can obtain optimal or maximum speeds.

Similarly, all of the NMOS transistors of a cell, e.g., transistors 151-1 and 151-2, and their fingers, can also be arranged in a vertically stacked group (i.e., a stack extending in the z-direction).

As described above, delay element 104 includes a plurality of tri-state inverter cells that each includes at least two types of transistor devices. For example, in some embodiments, first tri-state inverter cell 180 includes a PMOS stack 410-1 and an NMOS stack 411-1, as described above.

A second tri-state inverter cell 181, within delay element 104, also includes a PMOS stack 410-2 and an NMOS stack 411-2 as does tri-state inverter cell 190 having corresponding transistor devices arranged in a PMOS stack 410-25 and NMOS stack 411-25.

Similarly, delay element 106 includes a plurality of tri-state inverter cells that each includes at least two types of transistor devices. For example, in some embodiments, a first tri-state inverter cell 380 includes a PMOS stack 410-26 and an NMOS stack 411-26. A second tri-state inverter cell 381, within delay element 106, also includes a PMOS stack 410-27 and an NMOS stack 411-27, as does tri-state inverter cell 390 having corresponding transistor devices. Each of the individual transistor devices within each respective PMOS stack 410 and NMOS stack 411 includes a plurality of transistor devices (fingers) 400, arranged as shown in FIG. 2B.

Figure 3:
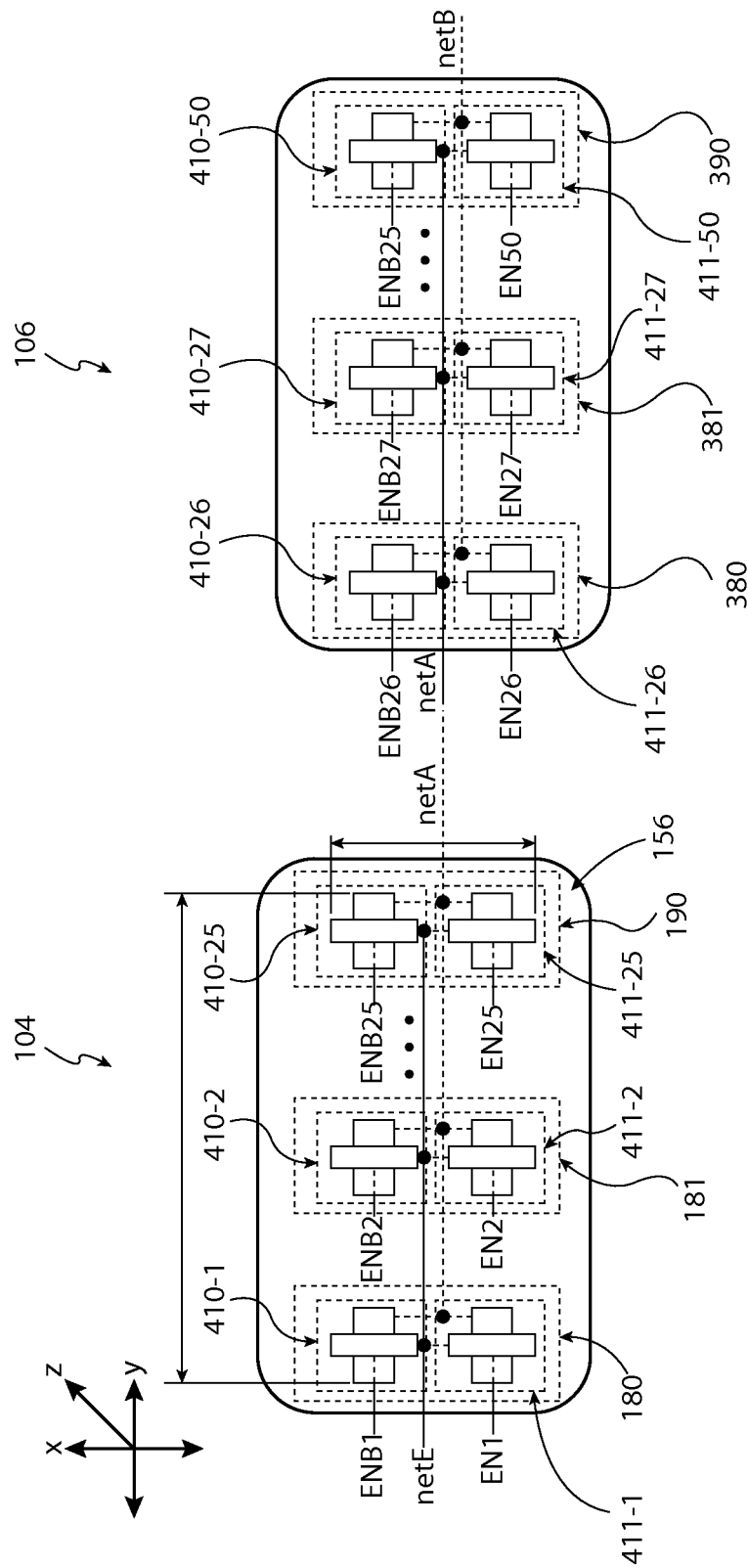
FIG. 3 is an alternative stacking layout of a plurality of devices of the delay element shown in FIG. 1B in accordance with some embodiments.

FIG. 3 is a plan view of two of the delay elements 104 and 106 in an example of a stacked CMOS embodiment of the DCO 100. Each delay element 104, 106, 108, 110, 112 includes a plurality of tri-state inverter cells that include at least two types of transistor devices arranged as described above with reference to FIGS. 2A-2D. Although first and second delay elements 104, 106 are illustrated as being laterally spaced from one another in a first (Y) direction, in other embodiments, first delay element 104 and second delay element 106 are disposed laterally with respect to one another in a second (Y) direction. In other embodiments, first delay element 104 and second delay element 106 are vertically stacked one on top of the other (i.e., in the z-direction).

Referring again to FIGS. 2B and 3, in delay element 106, the PMOS transistors 141-1 within the PMOS stack 410-26 of cell 380 are configured to receive the signal ENB26 at their gates, and the PMOS transistors 141-1 within the PMOS stack 410-27 of cell 381 are configured to receive the signal ENB27 at their gates. Similarly, the PMOS transistors 141-1 within the PMOS stack 410-50 of cell 390 are configured to receive the control signal ENB50 at their gates. The gates of the PMOS transistors 141-2 of the PMOS stack 410-26, which are coupled to netE, are configured to receive another signal such that cell 380 is configured to output an inverted signal in response to the received signal. The sources S of the PMOS transistors 141-2 of the PMOS stack 410-26 are coupled to netA.

NMOS transistor(s) 151-1 within the NMOS stack 411-26 of cell 380 are configured to receive the signal EN26 at their gates, and NMOS transistor(s) 251-1 within the NMOS stack 411-27 of cell 381 are configured to receive the signal EN27 at their gates. Similarly, the NMOS transistors of cell 390 are configured to receive the signal EN50 at their gates. NMOS transistor(s) 151-2 and 251-2 1 within the NMOS stack 411-27 of cell 381 have their gates coupled to netA and are configured to receive another signal such that cells 380, 381 are configured to output an inverted signal to netB in response to the received signals. Although the example of FIG. 1C describes the delay elements 104 and 106, the same description applies to the other delay elements (pairs of inverters).

Figure 4:
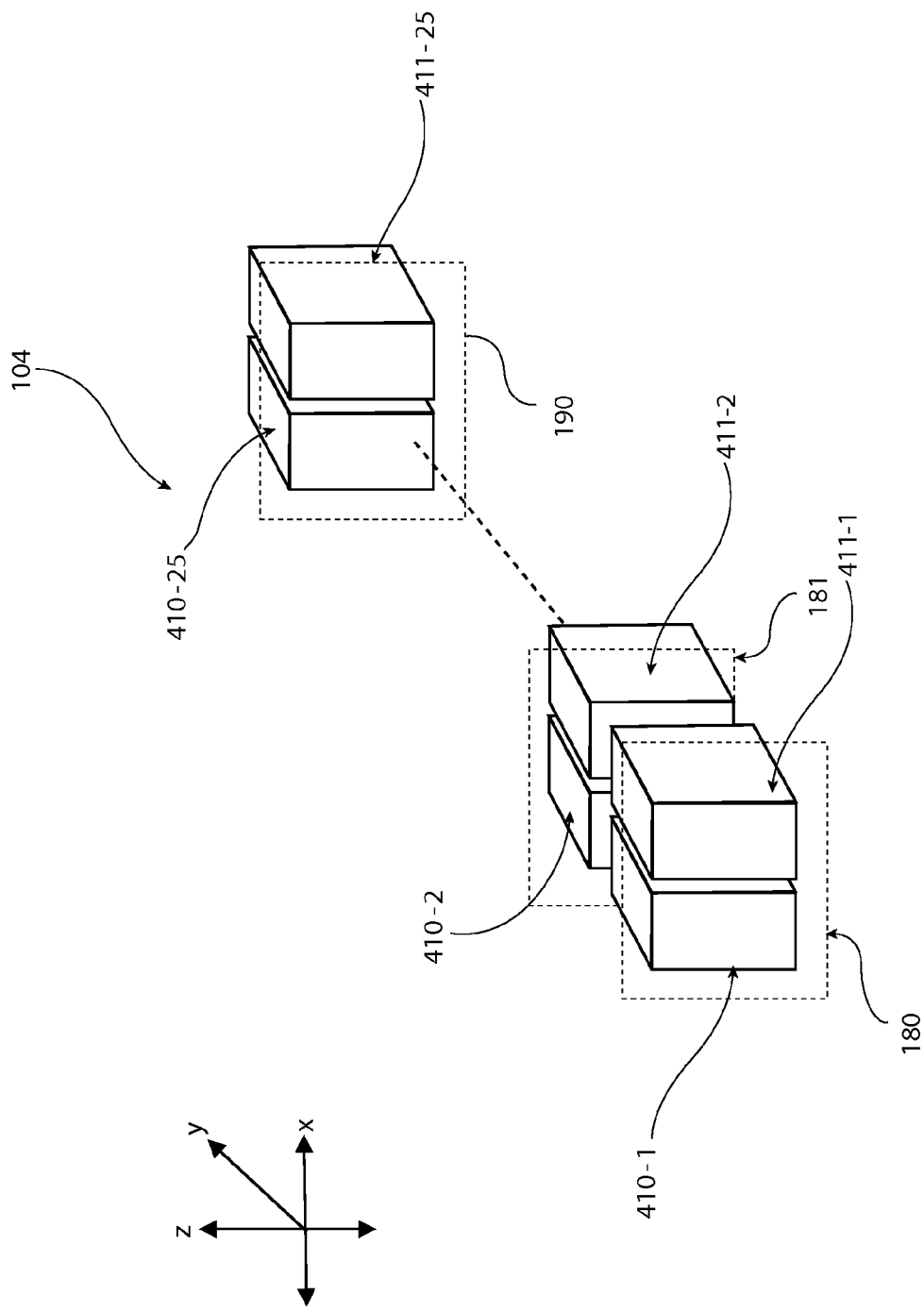
FIG. 4 is a cross-sectional view of a layout of a plurality of devices of one of the delay elements shown in FIG. 1C and taken from area 4 in FIG. 1C in accordance with some embodiments.

FIG. 4 illustrates one example of how the PMOS and NMOS transistors are arranged in each of the cells of delay element 104. In some embodiments, the PMOS stack 410 of each cell can be arranged with respect to the NMOS stack 411 of the cell in a first direction (e.g., the x-direction or y-direction). For example, in some embodiments as illustrated in FIG. 4, the PMOS stack 410-1 (including PMOS transistors 141-1 and 141-2 in cell 180) is disposed laterally in the x-direction with respect to the NMOS stack 411-1 (including NMOS transistors 151-1 and 151-2) such that the PMOS stack 410-1 is parallel with the NMOS stack 411-1. Similarly, for the next cell 181, the PMOS stack 410-2 (including PMOS transistors 241-1 and 241-2) is disposed laterally with respect to the NMOS stack 411-2 (including NMOS transistors 251-1 and 251-2) in the x-direction (or y-direction) such that the PMOS stack 410-2 is parallel with the NMOS stack 411-2. Such a stacking arrangement can occur for each of the cells.

Figure 5:
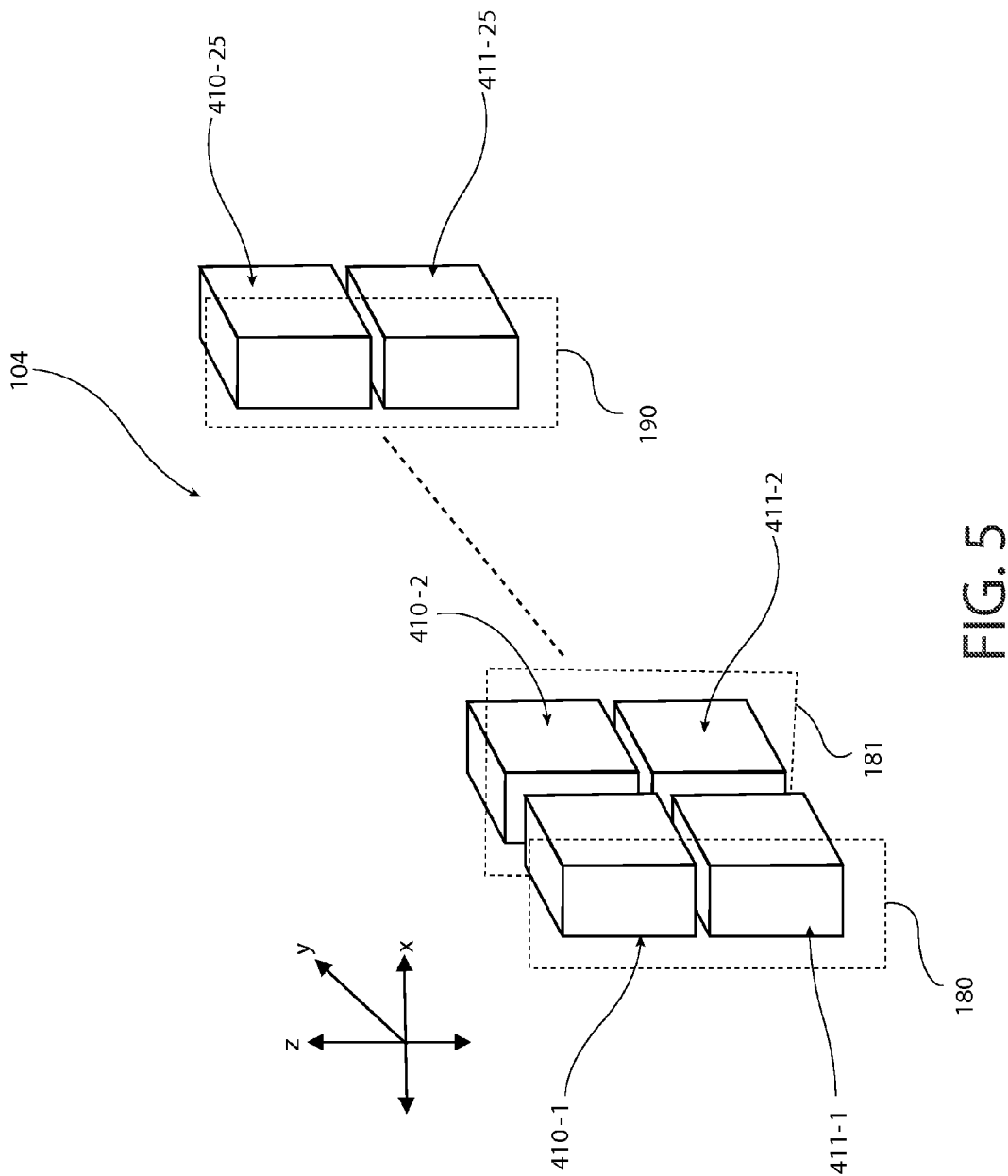
FIG. 5 is a perspective view of the portion of one of the plurality of devices shown in FIG. 4 in accordance with some embodiments.

Alternatively, the PMOS and NMOS transistors can be oriented in a different arrangement. For example, FIG. 5 illustrates an alternative arrangement for PMOS stacks 410 and NMOS stacks 411 that can be used in place of the arrangement shown in FIG. 4. As shown in some embodiments in FIG. 5, for cell 180, the PMOS stack 410-1 (including PMOS transistors 141-1 and 141-2) is vertically stacked (i.e., in the z-direction) on top of the NMOS stack 411-1 (including NMOS transistors 151-1 and 151-2). Similarly, for next cell 181, the PMOS stack 410-2 (including PMOS transistors 241-1 and 241-2) can be vertically stacked on top of the NMOS stack 411-2 (including NMOS transistors 251-1 and 251-2). A similar stacking arrangement can be used for cell 190.

Various embodiments of the DCO described herein are configured such that the wire capacitance is minimized or reduced. For example, in some embodiments, the DCO includes a plurality of delay elements that are disposed laterally with respect to one another in a first direction. Each delay element includes a plurality of cells, wherein each cell includes a plurality of devices, such as a plurality of at least two different types of transistor devices. For example, in some embodiments, each cell includes a plurality of PMOS transistors and a plurality of NMOS transistors, wherein the PMOS transistors are vertically stacked on top of each other and the NMOS transistors are vertically stacked on top of each other. The stack of NMOS transistors can be parallel with respect to the stack of PMOS transistors. Alternatively, the stack of NMOS transistors can be stacked on top of or below the stack of PMOS transistors. When the transistors are stacked, the length of the connection wire for the transistors is relatively lower than the length of the connection wire used for the transistors in known DCOs. Accordingly, the wire capacitance therein is relatively lower than known DCOs. Therefore, current consumption is reduced while enabling the DCO to achieve optimal or maximum speeds.

In some embodiments, a circuit includes a first delay element and at least one second delay element that is coupled to the first delay element, wherein each of the first and second delay elements are disposed laterally with respect to one another in a first direction and include at least one cell. The cell includes a plurality of transistors arranged in at least one stack.

In some embodiments, an integrated circuit includes a DCO that includes a first delay element and at least one second delay element that is coupled to the first delay element, wherein each of the first and second delay elements are disposed laterally with respect to one another in a first direction and include at least one cell. The cell includes a first plurality of transistors of a first type arranged in at least one first stack and a second plurality of transistors of a second type arranged in at least one second stack. The transistors of the first and second types are coupled together.

In some embodiments, a method includes receiving a first enablement signal at a gate of a first transistor of a first type. A second enablement signal that is complementary to the first enablement signal is received at a gate of a first transistor of a second type. The method also includes outputting at least one inverted signal in response to receiving a signal at a gate of a second transistor of the first type and at a gate of a second transistor of the second type, wherein the first and second transistors of the first type are arranged in a first stack. The first and second transistors of the second type are arranged in a second stack.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the invention.

What is claimed is:

1. A circuit comprising:
   a first delay element; and
   at least one second delay element coupled to the first delay element, wherein each of the first and second delay elements are disposed laterally with respect to one another in a first direction and each comprise at least one cell comprising a plurality of transistors arranged in at least two tiers of at least one stacked 3D integrated circuit, the at least two tiers arranged physically one above the other.

2. The circuit of claim 1, wherein the plurality of transistors comprise:
   a first plurality of transistors of a first type arranged in at least one first stack, at least two of the first plurality of transistors connected to each other by at least one inter-tier via; and
   a second plurality of transistors of a second type arranged in at least one second stack, at least two of the second plurality of transistors connected to each other by at least one inter-tier via, wherein the first and second pluralities of transistors of the first and second types are coupled together to form at least one inverter.

3. The circuit of claim 2, wherein the first plurality of transistors of the first type comprise a first group of at least one transistor and a second group of at least one transistor.

4. The circuit of claim 2, wherein the second plurality of transistors of the second type comprise a first group of at least one transistor and a second group of at least one transistor.

5. The circuit of claim 2, wherein the first plurality of transistors of the first type include a plurality of PMOS transistors, and wherein the second plurality of transistors of the second type include a plurality of NMOS transistors.

6. The circuit of claim 2, wherein each of the first and second pluralities of transistors of the first and second types comprise a plurality of serially connected transistor devices, and each of the first and second pluralities of transistors is connected to an adjacent one of the first and second pluralities of transistors by an inter-tier via.

7. The circuit of claim 2, wherein the at least one first stack of the first plurality of transistors of the first type is parallel with respect to the at least one second stack of the second plurality of transistors of the second type.

8. The circuit of claim 2, wherein the at least one first stack of the plurality of transistors of the first type is stacked above or below the at least one second stack of the second plurality of transistors of the second type.

9. The circuit of claim 2, wherein the first plurality of transistors of the first type are coupled together by at least one inter-tier via, and the second plurality of transistors of the second type are coupled together by at least another inter-tier via.

10. An integrated circuit comprising:
    a digital control ring oscillator comprising:
      a first delay element; and
      at least one second delay element coupled to the first delay element, wherein each of the first and second delay elements are disposed laterally with respect to one another in a first direction and comprise at least one cell comprising:
        a first plurality of transistors of a first type arranged in at least two tiers of at least one first stack of at least one stacked 3D integrated circuit; and
        a second plurality of transistors of a second type arranged in at least two tiers of at least one second stack of the at least one stacked 3D integrated circuit, the at least two tiers arranged physically one above the other in a direction normal to a plane of a substrate of the integrated circuit, wherein the first and second pluralities of transistors of the first and second types are coupled together.

11. The integrated circuit of claim 10, wherein the first plurality of transistors of the first type comprise a first group of at least one transistor and a second group of at least one transistor.

12. The integrated circuit of claim 10, wherein the second plurality of transistors of the second type comprise a first group of at least one transistor and a second group of at least one transistor.

13. The integrated circuit of claim 10, wherein the first plurality of transistors of the first type include a plurality of PMOS transistors and the second plurality of transistors of the second type include a plurality of NMOS transistors.

14. The integrated circuit of claim 10, wherein each of the first and second pluralities of transistors of the first and second types comprise a plurality of serially connected transistor devices.

15. The integrated circuit of claim 10, wherein the at least one first stacked 3D integrated circuit of the first plurality of transistors of the first type is parallel with respect to the at least one second stacked 3D integrated circuit of the second plurality of transistors of the second type.

16. The integrated circuit of claim 10, wherein the at least one first stacked 3D integrated circuit of the first plurality of transistors of the first type is stacked on top of the at least one second stacked 3D integrated circuit of the second plurality of transistors of the second type.

17. The integrated circuit claim 10, wherein the first plurality of transistors of the first type are coupled together by at least one via, and the second plurality of transistors of the second type are coupled together by at least another via.

18. A method comprising:
  receiving a first signal at a gate of a first transistor of a first type;
  receiving a second signal that is complementary to the first enablement signal at a gate of a first transistor of a second type; and
  outputting at least one inverted signal in response to receiving a signal at a gate of a second transistor of the first type and at a gate of a second transistors of the second type,
  wherein the first and second transistors of the first type are arranged in at least two tiers of a first stack within a stacked 3D integrated circuit, the at least two tiers of the first stack arranged physically one above the other, the first and second transistors of the second type are arranged in at least two tiers of a second stack within the stacked 3D integrated circuit, the at least two tiers of the second stack arranged physically one above the other.

19. The method of claim 18, wherein the first stack within the stacked 3D integrated circuit is disposed laterally adjacent to the second stack within the stacked 3D integrated circuit.

20. The method of claim 18, wherein the first stack within the stacked 3D integrated circuit of transistors is disposed vertically adjacent to the second stack within the stacked 3D integrated circuit of transistors.

* * * * *